(12) United States Patent
Norris et al.

(10) Patent No.: US 7,301,402 B2
(45) Date of Patent: Nov. 27, 2007

(54) SOFT SATURATION DETECTION FOR POWER AMPLIFIERS

(75) Inventors: George B. Norris, Gilbert, AZ (US); Benjamin R. Gilsdorf, Phoenix, AZ (US); David A. Newman, Tempe, AZ (US)

(73) Assignee: Freescale Semiconductor, Inc., Austin, TX (US)

(\*) Notice: Subject to any disclaimer, the term of this patent is extended or adjusted under 35 U.S.C. 154(b) by 121 days.

(21) Appl. No.: 11/282,734

(22) Filed: Nov. 17, 2005

(65) Prior Publication Data

US 2007/0109055 A1    May 17, 2007

(51) Int. Cl.
*H03F 1/52* (2006.01)
(52) U.S. Cl. ....................................... 330/298
(58) Field of Classification Search ............... 330/298, 330/207 P; 455/117
See application file for complete search history.

(56) References Cited

U.S. PATENT DOCUMENTS

| 6,430,402 | B1* | 8/2002 | Agahi-Kesheh .......... 455/115.3 |
| 6,476,677 | B1 | 11/2002 | Komaili et al. |
| 6,741,840 | B2 | 5/2004 | Nagode et al. |
| 2004/0176049 | A1 | 9/2004 | Nagode et al. |
| 2004/0198301 | A1 | 10/2004 | Rozenblit et al. |
| 2005/0093625 | A1 | 5/2005 | Khlat et al. |

\* cited by examiner

*Primary Examiner*—Steven J. Mottola
(74) *Attorney, Agent, or Firm*—Ingrassia Fisher & Lorenz

(57) ABSTRACT

A soft saturation detection circuit for a radio frequency ("RF") power amplifier is configured to detect the onset of soft saturation in an unambiguous and accurate manner. The circuit compares the time derivative of a voltage signal indicative of the RF output power to the time derivative of a control voltage signal for the RF power amplifier. The circuit also employs a gating mechanism that ensures that a soft saturation indication signal is generated under appropriate operating conditions.

20 Claims, 7 Drawing Sheets

SOFT SATURATION DETECTION FOR POWER AMPLIFIERS

TECHNICAL FIELD

The present invention relates generally to radio frequency ("RF") power amplifiers. More particularly, the present invention relates to soft saturation detection techniques for RF power amplifiers.

BACKGROUND

The prior art is replete with RF power amplifiers suitable for use with numerous practical applications. For example, mobile telephones and other wireless communication devices are common applications for RF power amplifiers. In mobile telephone applications, the RF output power level for the transmit signal may vary over time due to operating conditions and/or output power modulation schemes. An RF power amplifier becomes saturated when the change in output power decreases to zero with an increase in a control variable (e.g., an output power control voltage). Operation in a saturated condition may result in distortion and can compromise the operation of a closed loop control scheme for the RF power amplifier.

The term "soft saturation" refers to operation of an RF power amplifier in a region that precedes the actual saturation point. A number of detection techniques have been developed to detect the onset of soft saturation before serious distortion or control issues arise. For example, prior art techniques rely on the detection of a maximum triggering level of a control voltage signal in the RF power amplifier, below which the amplifier operation is unaffected by the effects of saturation. In practice, however, the triggering level for a given RF power amplifier can vary from unit to unit and even within a given unit over different operating conditions. Consequently, a fixed triggering level may not correspond to optimal soft saturation detection in all cases and these soft saturation detection techniques may rely on ambiguous detection thresholds. Such ambiguity may cause the detection scheme to overshoot or undershoot the actual onset of soft saturation in the RF power amplifier. Although undershooting the onset of soft saturation will not adversely affect the operation of the RF power amplifier, undershooting results in inefficient use of available output power. Undershooting in this manner will result from very conservative threshold levels, which require excessive headroom with lower battery efficiency for mobile applications. Otherwise, substantial amounts of calibration are required (e.g., phasing) during manufacture of the device. In contrast, overshooting the onset of soft saturation may result in actual hard saturation of the RF power amplifier and the associated distortion and control issues mentioned above.

Accordingly, it is desirable to have a soft saturation detection technique, suitable for use with RF power amplifiers, that unambiguously measures the amount of saturation occurring in the amplifier using signals available in the amplifier circuit. In addition, it is desirable to have a soft saturation detection circuit that provides an accurate and device independent measure of approaching saturation in an RF power amplifier. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
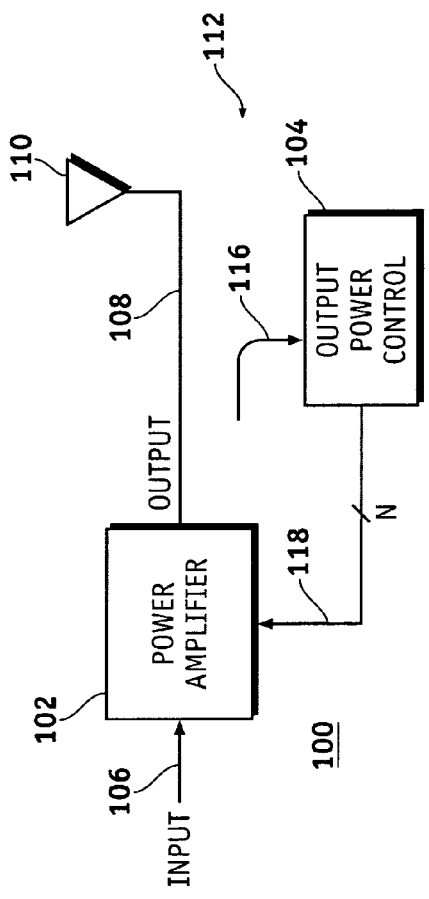
FIG. 1 is a schematic representation of an RF power amplifier circuit configured in accordance with an example embodiment of the invention.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various circuit components, e.g., transistors, logic elements, discrete components, or the like, which may carry out a variety of functions under the control of suitable control devices. In addition, those skilled in the art will appreciate that the present invention may be practiced in conjunction with any number of practical circuits, subsystems, or systems, and that the RF power amplifier deployment described herein is merely one exemplary application for the invention.

For the sake of brevity, conventional techniques related to RF power amplifier design, RF signal coupling, RF signal detection, analog circuit design, digital circuit design, and other functional aspects of the circuits (and the individual operating components of the circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present.

Furthermore, two or more nodes may be realized by one physical element (and two or more signals can be multiplexed, modulated, or otherwise distinguished even though received or output at a common mode).

The following description may refer to nodes or features being "connected" or "coupled" together. As used herein, unless expressly stated otherwise, "connected" means that one node/feature is directly joined to (or directly communicates with) another node/feature, and not necessarily mechanically. Likewise, unless expressly stated otherwise, "coupled" means that one node/feature is directly or indirectly coupled to (or directly or indirectly communicates with) another node/feature, and not necessarily mechanically. Thus, although the schematics shown in the figures depict example arrangements of elements, additional intervening elements, devices, features, or components may be present in an actual embodiment (assuming that the functionality of the circuit is not adversely affected).

A soft saturation detection circuit for an RF power amplifier is described in detail herein. The detection circuit can detect the onset of soft saturation in an RF power amplifier without excessive calibration and in a manner that is more robust to parametric and/or environmental changes (e.g., variation in temperature, voltage, input drive, input frequency, output loading, or the like). The soft saturation detection circuit is configured to directly sense the saturation mechanism that is to be controlled in a practical manner using changes in voltage signals that are readily available from the RF power amplifier circuit itself. In other words, the detection circuit can measure or detect the actual quantity related to saturation of the RF power amplifier, as opposed to a signal or quantity at which saturation is supposed to occur. In contrast, prior art techniques sense a voltage level that must be correlated with the saturation and which varies with changing operating conditions and from unit to unit. Practical implementations of the detection circuit can be realized in either the analog domain or the digital domain. For example, the circuits described herein may be utilized in RF power amplifiers and front end modules for GSM or GSM/EDGE mobile devices to prevent clipping and to ensure compliance with specified transmit burst time mask and switching specifications. In particular, the circuits described herein can be employed in connection with a variety of bursted transmission communication systems that use output power control schemes.

FIG. 1 is a schematic representation of an RF power amplifier circuit 100 configured in accordance with an example embodiment of the invention. Circuit 100 generally includes an RF power amplifier 102 and an output power control architecture 104 coupled to RF power amplifier 102. In this example, which is suitable for use with a wireless communication device, RF power amplifier 102 receives an input signal 106 and generates an RF output signal 108 having desired output characteristics. In practice, the frequency, amplitude, phase, and other characteristics of RF output signal 108 are dictated by the particular application. RF power amplifier 102 drives an RF antenna 110 for transmission of RF output signal 108.

RF power amplifier circuit 100 preferably includes an RF coupler 112, which is suitably configured to obtain a coupled incident signal 116 for output power control architecture 104. In practice, coupled incident signal 116 is based upon a forward incident component of RF output signal 108. RF coupler 112 can be realized as a directional coupler having an incident port. In a practical implementation, RF coupler 112 can be integrated into an output harmonic filter for RF power amplifier 102, thus minimizing insertion loss and conserving physical space. RF coupler 112 may incorporate an RF transmission line that provides a suitable amount of coupling relative to RF output signal 108. For example, RF coupler 112 may be realized as a −20 dB coupler using any suitable construction.

Briefly, output power control architecture 104 is configured to adjust operating characteristics of RF power amplifier 102 in response to coupled incident signal 116. Although not depicted in FIG. 1, output power control architecture 104 may include or communicate with suitable control or processing logic that influences its operation, sets initial parameter settings, or the like. Output power control architecture 104 is suitably configured to generate at least one control signal 118 for RF power amplifier 102, where the control signal(s) 118 have characteristics influenced by coupled incident signal 116. As depicted in FIG. 1, output power control architecture 104 can generate any number (N) of control signals 118, where the actual number depends upon the particular application. Furthermore, a given control signal 118 may be a bias voltage, a bias current, a supply voltage, a supply current, or a digital control signal that influences bias or supply voltages or currents, and a given control signal 118 may be applied to any number of amplifier stages associated with RF power amplifier 102. As described in more detail below, output power control architecture 104 is preferably configured to obtain an output voltage signal that is indicative of RF output signal 108.

Figure 2:
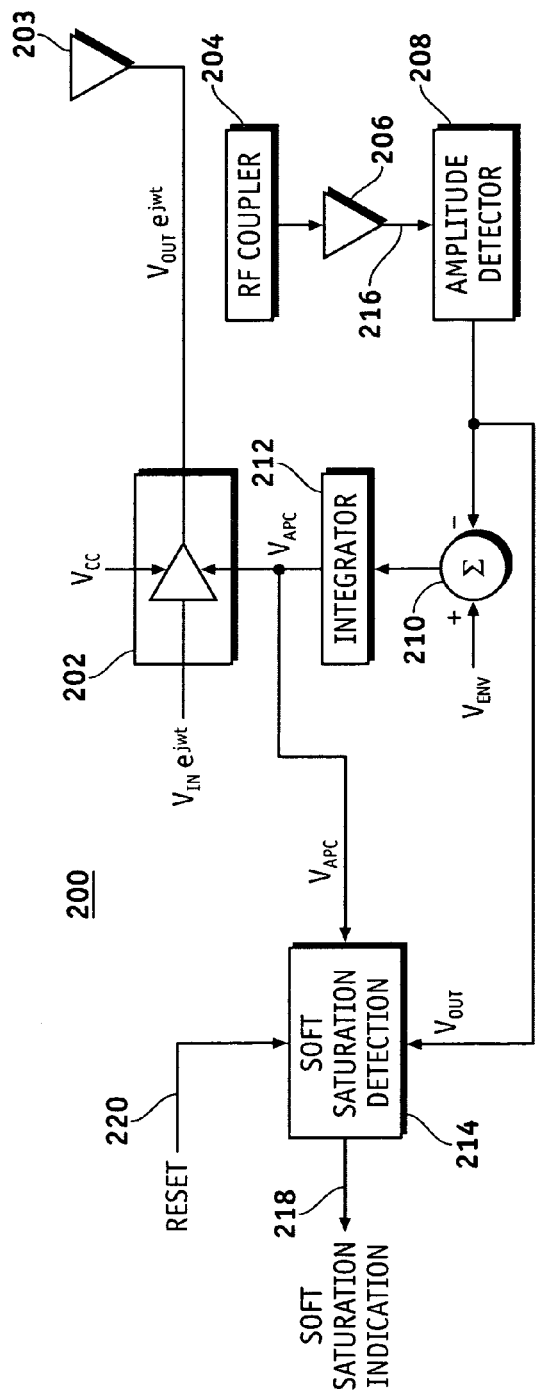
FIG. 2 is a schematic representation of an electronic circuit configured in accordance with an example embodiment of the invention.

FIG. 2 is a schematic representation of an electronic circuit 200 configured in accordance with an example embodiment of the invention. Circuit 200 is suitable for use in transmitters of cell phones supporting, for example, EDGE/GSM standards. The input RF signal to be amplified includes amplitude envelope and phase constituents. As illustrated in FIG. 2, the RF carrier without amplitude modulation, $V_{IN}e^{jwt}$, is applied at the input of the RF power amplifier. The amplitude constituent, $V_{ENV}$, is applied through a summing junction to modulate the biases of the amplifier stages, thereby reconstituting the envelope on the phase modulated signal. Preserving the envelope characteristics is achieved via the power control techniques described in more detail herein.

Circuit 200 generally includes an RF power amplifier 202, an RF antenna 203, an RF coupler 204, an RF attenuator/gain element 206, an amplitude detector 208, a summer 210, an integrator 212, and a soft saturation detection circuit 214. In a practical embodiment, summer 210 and integrator 212 may be realized as a single element or component. RF attenuator/gain element 206, amplitude detector 208, summer 210, and integrator 212 collectively may be considered to be an output power control architecture as described above in connection with circuit 100. The output power control architecture (more specifically, amplitude detector 208) is suitably configured to obtain an output voltage signal ($V_{OUT}$), where $V_{OUT}$ is indicative of the RF output power signal.

RF power amplifier 202 may be a full polar amplifier that operates in the manner described above. As depicted in FIG. 2, the amplitude constituent of the RF input signal ($V_{ENV}$) serves as one input to summer 210, and the phase constituent of the RF input signal ($V_{IN}e^{jwt}$) serves as an input to RF power amplifier 202. RF power amplifier 202 is suitably configured to generate an RF output power signal ($V_{OUT}e^{jwt}$), which is utilized to drive RF antenna 203 in this example. In practice, RF power amplifier 202 generates the RF output power signal in response to an output power control signal ($V_C$) applied to RF power amplifier 202. In this example, $V_C$ corresponds to $V_{APC}$, which represents an output of integrator 212; alternatively, the output power control signal can be a signal that is derived from an output of integrator 212, any signal generated by circuit 200, or any signal that is otherwise appropriate for the particular application. Due to the loop arrangement of circuit 200, $V_{APC}$ is generated in response to $V_{OUT}$.

RF coupler 204, which may be configured to operate as described above in connection with RF coupler 112, obtains a coupled incident signal associated with the RF output power signal. This coupled incident signal may serve as an input to RF attenuator/gain element 206. RF attenuator/gain element 206, which has an input coupled to RF coupler 204, is suitably configured to adjust the magnitude of the coupled incident signal to a level appropriate for the current operating conditions. RF attenuator/gain element 206 adjusts the level of the coupled incident signal to increase the dynamic range of amplitude detector 208. In a practical embodiment, circuit 200 may utilize a suitable control scheme to initialize RF attenuator/gain element 206 in accordance with the desired level for the RF output power signal. Thereafter, the initial settings can be altered as the desired level for the RF output power signal changes to suit the dynamic needs of the particular application.

In a practical embodiment of circuit 200, RF attenuator/gain element 206 is realized as an adjustable or programmable component having a suitable adjustment range for varying the average power level of the coupled incident signal. In one example embodiment, RF attenuator/gain element 206 provides 28 dB of programmable attenuation/gain. In operation, RF attenuator/gain element 206 is controlled to attenuate or amplify the coupled signal as needed to set the loop parameters of circuit 200. Thus, RF attenuator/gain element 206 produces an attenuated/amplified RF signal 216.

Amplitude detector 208 has an input coupled to the output of RF attenuator/gain element 206. Amplitude detector 208 is suitably configured to quantify the amplitude of attenuated/amplified RF signal 216. Moreover, amplitude detector 208 is preferably configured to generate the output voltage signal ($V_{OUT}$), which is indicative of the detected amplitude of attenuated/amplified RF signal 216. In the example embodiment, amplitude detector 208 is a linear amplitude detector that is capable of detecting amplitude levels corresponding to attenuated/amplified RF signal 216, where the output voltage signal ($V_{OUT}$) is indicative of the particular amplitude level. Alternatively, amplitude detector 208 may be realized as a logarithmic detector. In practice, the output voltage signal ($V_{OUT}$) is a varying signal, where the particular voltage level represents the current detected amplitude of attenuated/amplified RF signal 216.

Summer 210 compares the amplitude constituent of the RF input signal ($V_{ENV}$) with $V_{OUT}$. In this example, the output of summer 210 corresponds to $V_{ENV}$ minus $V_{OUT}$. The output of summer 210 may serve as an input to integrator 212, which is suitably configured to perform averaging or filtering of its input to obtain an average power level indication. In practice, integrator 212 can be realized as a gain stage that is also configured to provide a suitable amount of loop gain for circuit 200.

Although not depicted in FIG. 2, circuit 200 may include a suitably configured bias signal generator that is configured to generate at least one bias control signal for RF power amplifier 202. As described above, such bias control signal(s) influence the output power of RF power amplifier 202, and the bias control signal(s) may be realized as a bias voltage, a bias current, a supply voltage, a supply current, a digital control signal that influences bias or supply voltages or currents, or the like. Furthermore, multiple bias control signals may be utilized to independently control separate stages of a practical RF power amplifier 202. In this example embodiment, the functionality of the bias signal generator may be incorporated into integrator 212, and the $V_{APC}$ signal represents a bias control signal for RF power amplifier 202.

Soft saturation detection circuit 214 is coupled to the output power control architecture to obtain the $V_{OUT}$ signal and the $V_{APC}$ signal (or respective signals derived or otherwise associated with the $V_{OUT}$ signal and the $V_{APC}$ signal). Soft saturation detection circuit 214 is generally configured to process the $V_{OUT}$ signal and the $V_{APC}$ signal to determine the onset of soft saturation of RF power amplifier 202. In practical embodiments, soft saturation detection circuit 214 generates a soft saturation indication signal 218 upon detection of soft saturation. Soft saturation detection indication signal 218 may then trigger a limiting action by the transmitter power control algorithm and hardware to ensure that RF power amplifier 202 is not driven further into saturation. Soft saturation detection circuit 218 may be controlled by a reset signal 220, which is activated to reset the operation of soft saturation detection circuit 218 between transmit bursts. For example, reset signal 220 may clear a flip-flop that indicates a soft saturation detection from a previous iteration.

Figure 3:
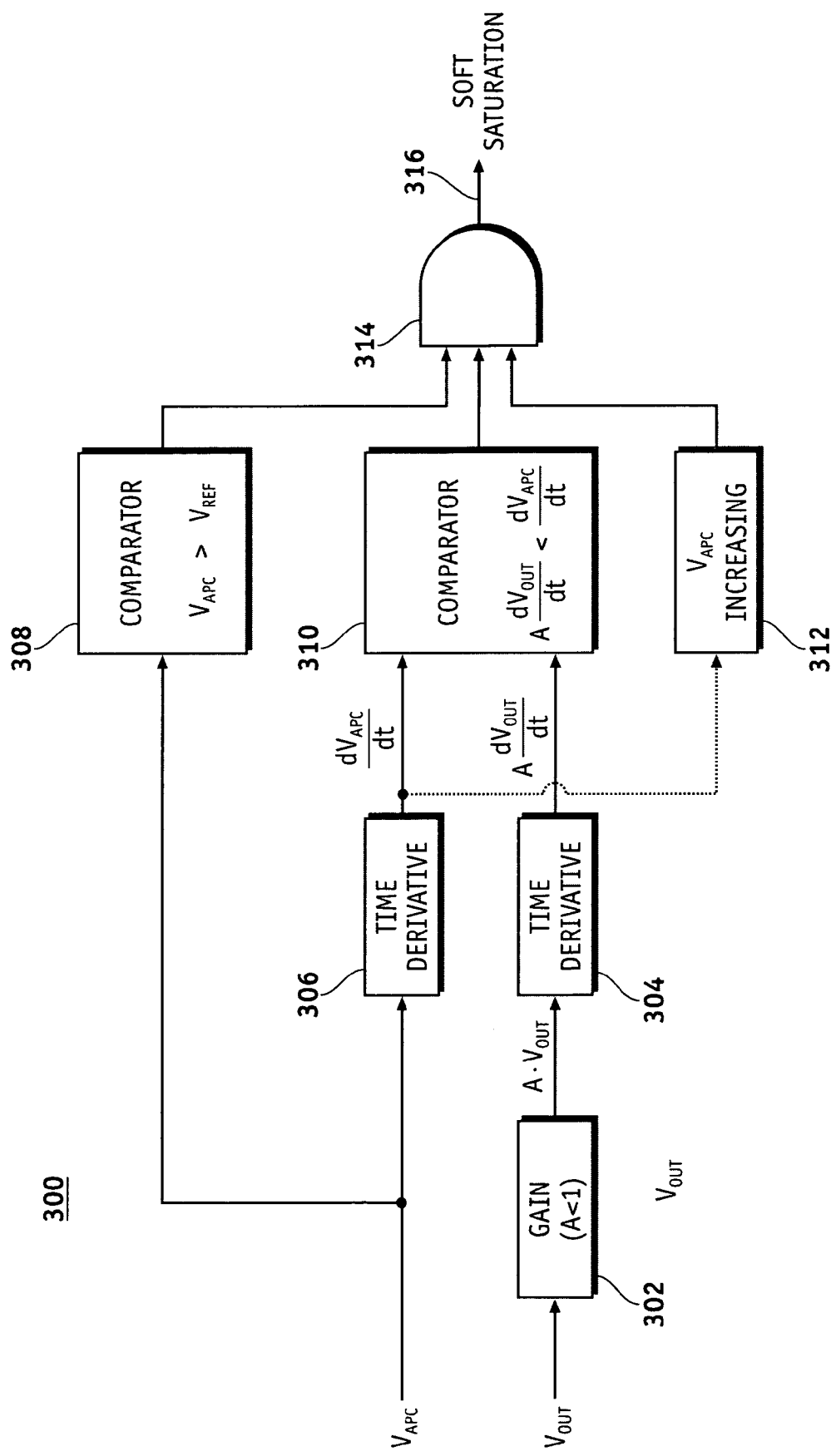
FIG. 3 is a schematic representation of a soft saturation detection circuit configured in accordance with an example embodiment of the invention.

FIG. 3 is a schematic representation of a soft saturation detection circuit 300 configured in accordance with an example embodiment of the invention. Soft saturation detection circuit 300 may be deployed in the context of circuit 200. The functional components of soft saturation detection circuit 300 may be realized using analog circuit techniques and/or digital circuit techniques.

Soft saturation detection circuit 300 generally includes a gain element 302, a differentiator (depicted as two time derivative elements 304/306), a voltage comparator 308, a derivative comparator 310, a ramp detector 312, and a gating mechanism 314. Circuit 300 is suitably configured to obtain $V_{APC}$ and $V_{OUT}$ as inputs, and to produce a soft saturation indication signal 316 as an output. In this example embodiment, voltage comparator 308, derivative comparator 310, ramp detector 312, and gating mechanism 314 collectively may be considered to be a soft saturation signal generator for circuit 300.

Figure 4:
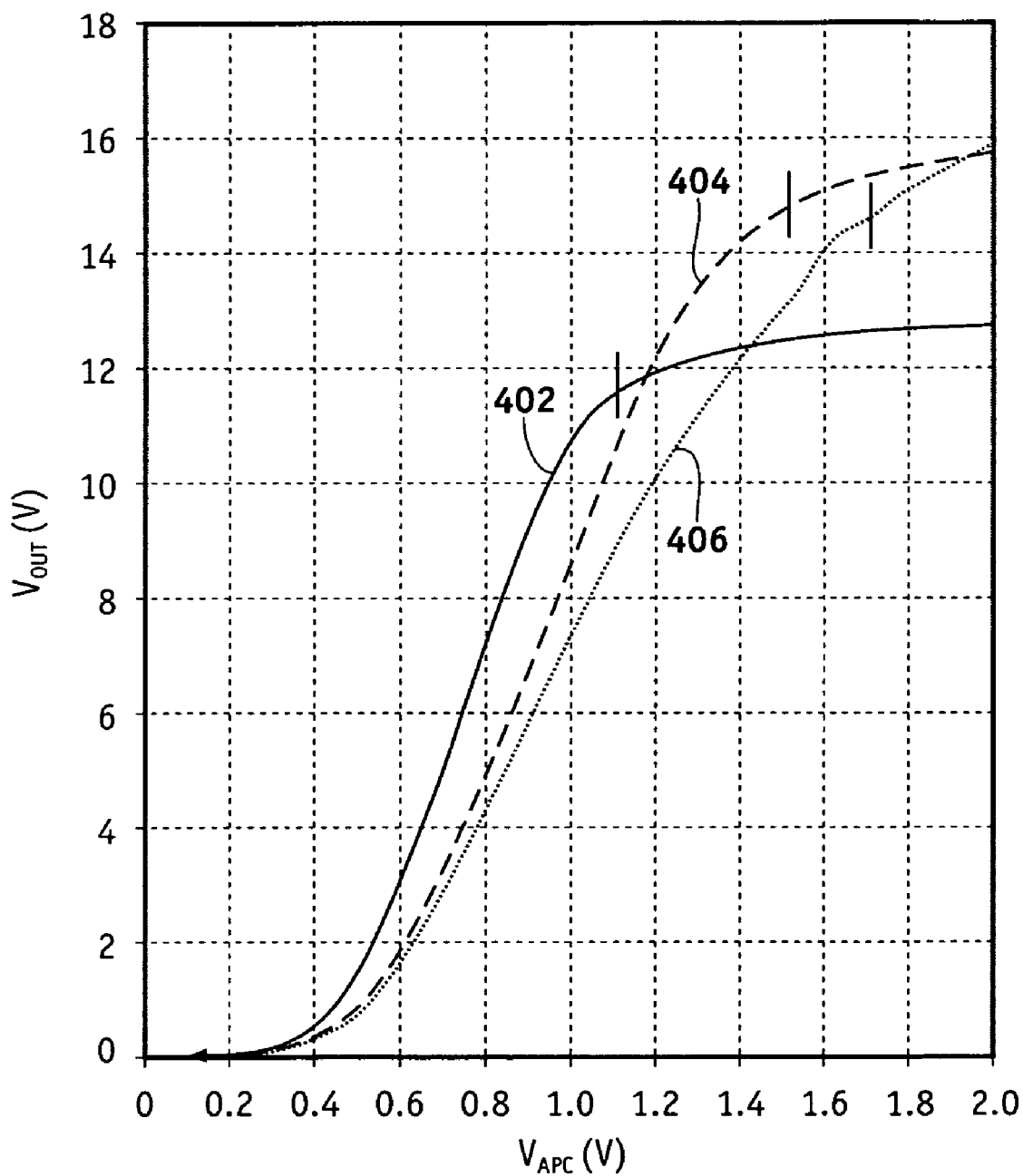
FIG. 4 is a graph depicting onset of soft saturation in an RF power amplifier for different output loading conditions.

As mentioned above, conventional soft saturation detection solutions rely on a fixed limiting voltage threshold, which may routinely vary depending upon may factors, including process variation, temperature, supply voltage, output VSWR, frequency, input power, and the like. In this regard, FIG. 4 is a graph of $V_{OUT}$ versus $V_{APC}$ for different output loading conditions. This graph illustrates the onset of soft saturation for the RF power amplifier under different operating conditions. Plot 402 corresponds to a "worst case" VSWR condition, plot 404 corresponds to a nominal 50 ohm load condition, and plot 406 corresponds to a "best case" VSWR condition. The vertical marks on the plots roughly indicate the onset of soft saturation for the depicted operating conditions. Notably, the optimum soft saturation trigger value of $V_{APC}$ varies by more than 0.5 volts over this example range of different conditions, and the variation of $V_{APC}$ can vary by more than 1.5 volts in a practical implementation. Consequently, use of a single fixed $V_{APC}$ value as the soft saturation indication point can produce ambiguous results.

Figure 5:
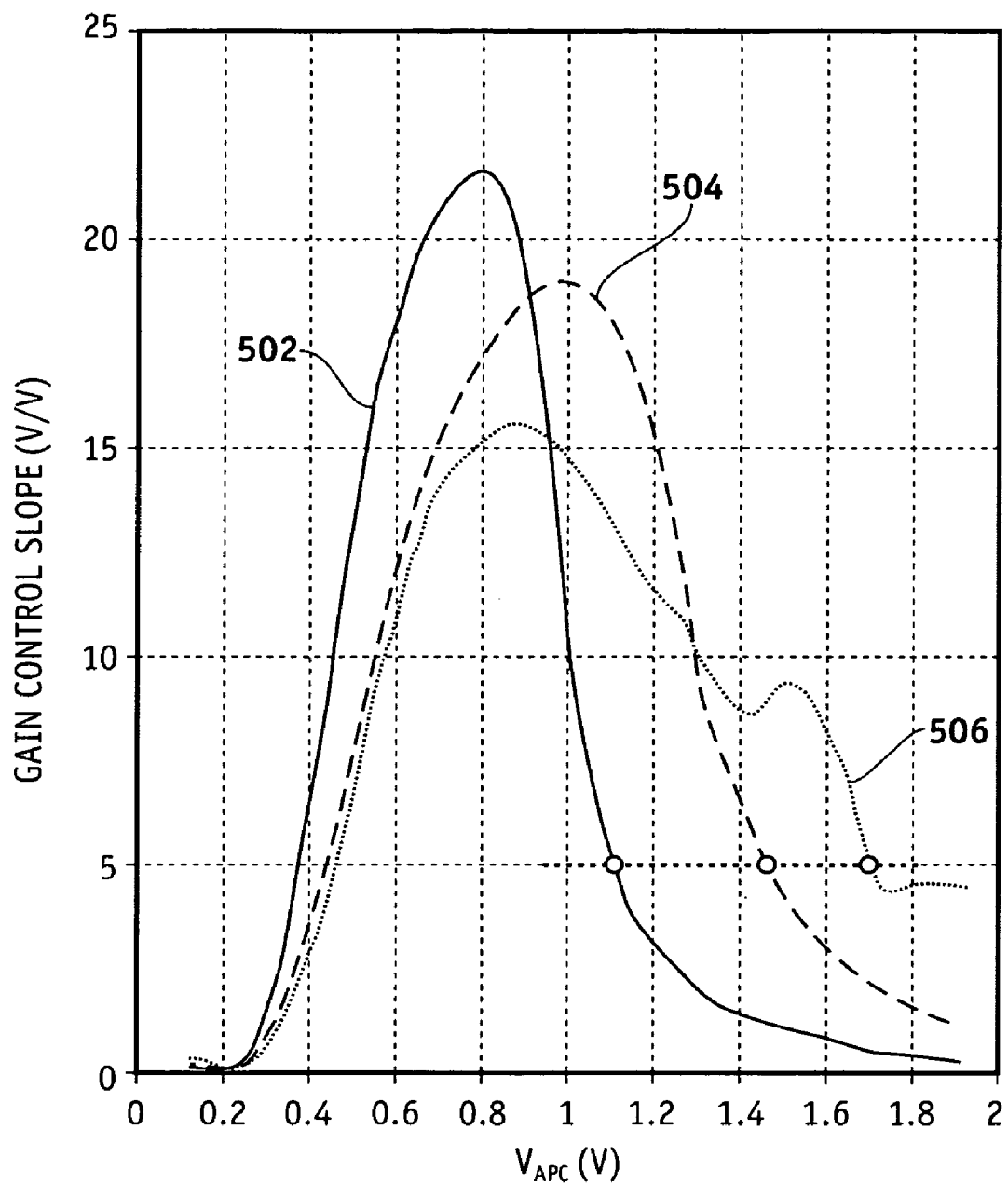
FIG. 5 is a graph of gain control slope of an RF power amplifier for different output loading conditions.

Soft saturation detection circuit 300 overcomes the limitations of conventional techniques by directly sensing the root cause of the problem: the reduction in output voltage change with associated control voltage change. This is succinctly stated as triggering a soft saturation limit when the derivative of $V_{OUT}$ with respect to $V_{APC}$ (also known as the gain control slope) falls below a set limit, or:

$$\frac{dV_{OUT}}{dV_{APC}} < K(V/V),$$

where K is a constant that is selected according to the particular application to facilitate the enhanced soft saturation detection techniques described herein. The quantity $$\frac{dV_{OUT}}{dV_{APC}}$$

is known as the gain control slope. In this regard, FIG. 5 is a graph of gain control slope versus $V_{APC}$ for different output loading conditions. Plot 502 corresponds to the worst case VSWR condition, plot 504 corresponds to the nominal 50 ohm load condition, and plot 506 corresponds to the best case VSWR condition. Assume, for example, that circuit 300 limits power on a minimum gain control slope value of 5.0 (FIG. 5 includes dots on the plots corresponding to this value). The value of 5.0 approximates the 95% capability level of an example RF power amplifier, and the value of 5.0 captures the range of different $V_{APC}$ values corresponding to onset of soft saturation. Thus, the use of this parameter as a soft saturation trigger captures an appropriate limiting value of $V_{APC}$, regardless of frequency, power, or VSWR. In practice, the actual value of this parameter may be empirically determined via bench testing, simulations, or other techniques.

Practical implementations of circuit 300 take advantage of the following methodology. The expression $$\frac{dV_{OUT}}{dV_{APC}} < \frac{1}{A}$$

can be rewritten as $$A\frac{dV_{OUT}}{dt} < \frac{dV_{APC}}{dt} \text{ if } \frac{dV_{APC}}{dt} > 0,$$

where A is constant over time. Accordingly, circuit 300 can be realized with: a gain element (the gain A, although constant over time, is variable in that it can be adjusted and set as needed at phasing); a source of time change in $V_{APC}$ and/or $V_{OUT}$ with known polarity (either increasing or decreasing); a computation of the time derivative of $V_{APC}$ and $V_{OUT}$; and a comparator to compare $$A\frac{dV_{OUT}}{dt} \text{ to } \frac{dV_{APC}}{dt}.$$

Referring again to FIG. 3, gain element 302 is easily accomplished using known techniques, the source of time change can be provided by the rising edge of the transmit burst with well known and repeatable characteristics, time derivative elements 306 and 308 can be provided by active high pass filtering, and derivative comparator 310 is easily accomplished using known voltage comparator techniques.

Circuit 300 preferably employs gating mechanism 314 (e.g., an AND gate function) to gate soft saturation indication signal 316 such that: (1) low gain control slope on initial burst turn-on is not detected as soft saturation; and (2) opposite polarity derivatives on burst turn-off is not detected as soft saturation. Condition (1) is easily detected by a non-critical threshold on the $V_{APC}$ signal that arms soft saturation detection circuit 300 only when the burst power exceeds a threshold, such as one-quarter to one-half of the maximum range. This is feasible because typical gain control slopes for RF power amplifiers are very low only at initial turn-on and when approaching power saturation. Condition (2) can be set by the baseband transmitter logic, which has access to the timing of the transmit burst. In alternative implementations, circuit 300 could be provided with an RF power amplifier control block and the appropriate burst gating could be separately applied in the baseband transmitter logic as part of the response to the soft saturation detection.

Accordingly, gain element 302 is suitably configured to multiply $V_{OUT}$ by a constant (A) to obtain a scaled output voltage signal ($AV_{OUT}$). In this example, A is less than one for consistency with the above expressions. The differentiator for circuit 300 includes an input for $V_{APC}$ and an input for $AV_{OUT}$. In this example, $AV_{OUT}$ serves as an input to time derivative element 304 and $V_{APC}$ serves as an input to time derivative element 306. Time derivative element 304 is configured to calculate/generate a time derivative of $AV_{OUT}$, and the output of time derivative element 304 corresponds to $$A\frac{dV_{OUT}}{dt}.$$

Time derivative element 306 is configured to calculate/generate a time derivative of $V_{APC}$, and the output of time derivative element 306 corresponds to $$\frac{dV_{APC}}{dt}.$$

Circuit 300 employs a soft saturation signal generator that is suitably configured to determine the onset of soft saturation based upon $$A\frac{dV_{OUT}}{dt} \text{ and } \frac{dV_{APC}}{dt}.$$

In this example, the soft saturation signal generator includes voltage comparator 308, derivative comparator 310, ramp detector 312, and gating mechanism 314. Briefly, circuit 300 may be configured to indicate soft saturation if $$\frac{dV_{OUT}}{dt} \Big/ \frac{dV_{APC}}{dt} < \frac{1}{A}.$$

Alternatively, and as illustrated in FIG. 3, circuit 300 may be configured to indicate soft saturation if $$A\frac{dV_{OUT}}{dt} < \frac{dV_{APC}}{dt},$$

and if $$\frac{dV_{APC}}{dt} > 0.$$

In this example, voltage comparator 308 compares $V_{APC}$ to a voltage reference ($V_{REF}$), where the voltage reference is a minimum level that corresponds to a time following initial burst turn-on. $V_{REF}$ is preferably chosen such that it marks a point that occurs after the initial steep increase in the gain control slope plots for the RF power amplifier. Voltage comparator 308 is configured to generate a logic high signal as an output if $V_{APC}$ is greater than $V_{REF}$, and to otherwise generate a logic low signal as an output. Derivative comparator 310, which may also be realized as a voltage comparator, compares $$A\frac{dV_{OUT}}{dt} \text{ to } \frac{dV_{APC}}{dt}.$$

Derivative comparator 310 is configured to generate a logic high signal as an output if $$A\frac{dV_{OUT}}{dt}$$

is greater than $$\frac{dV_{APC}}{dt},$$

and to otherwise generate a logic low signal as an output. Ramp detector 312 is suitably configured to determine whether $V_{APC}$ is increasing. Alternatively (or additionally), circuit 300 may employ a ramp detector that determines whether $V_{OUT}$ is increasing. In practical embodiments, ramp detector 312 may be realized as a voltage comparator or provided by external means (the dashed line in FIG. 3 indicates that the depicted configuration for ramp detector 312 is optional). Ramp detector 312 generates a logic high signal as an output if $V_{APC}$ is increasing, and otherwise generates a logic low signal as an output.

Gating mechanism 314 functions to generate a logic high soft saturation indication signal 316 when all of the necessary conditions are met, i.e., when all of the inputs to gating mechanism 314 are logic high. In other words, circuit 300 disables generation of an actionable soft saturation indication signal if $V_{APC}$ is less than $V_{REF}$, and disables generation of an actionable soft saturation indication signal if $V_{APC}$ (and/or $V_{OUT}$) is not increasing with time. Accordingly, gating mechanism 314 is configured to enable generation of an active or actionable soft saturation indication signal 316 if:

$$A\frac{dV_{OUT}}{dt} < \frac{dV_{APC}}{dt}; V_{APC} > V_{REF}; \text{ and } \frac{dV_{APC}}{dt} > 0.$$

Figure 6:
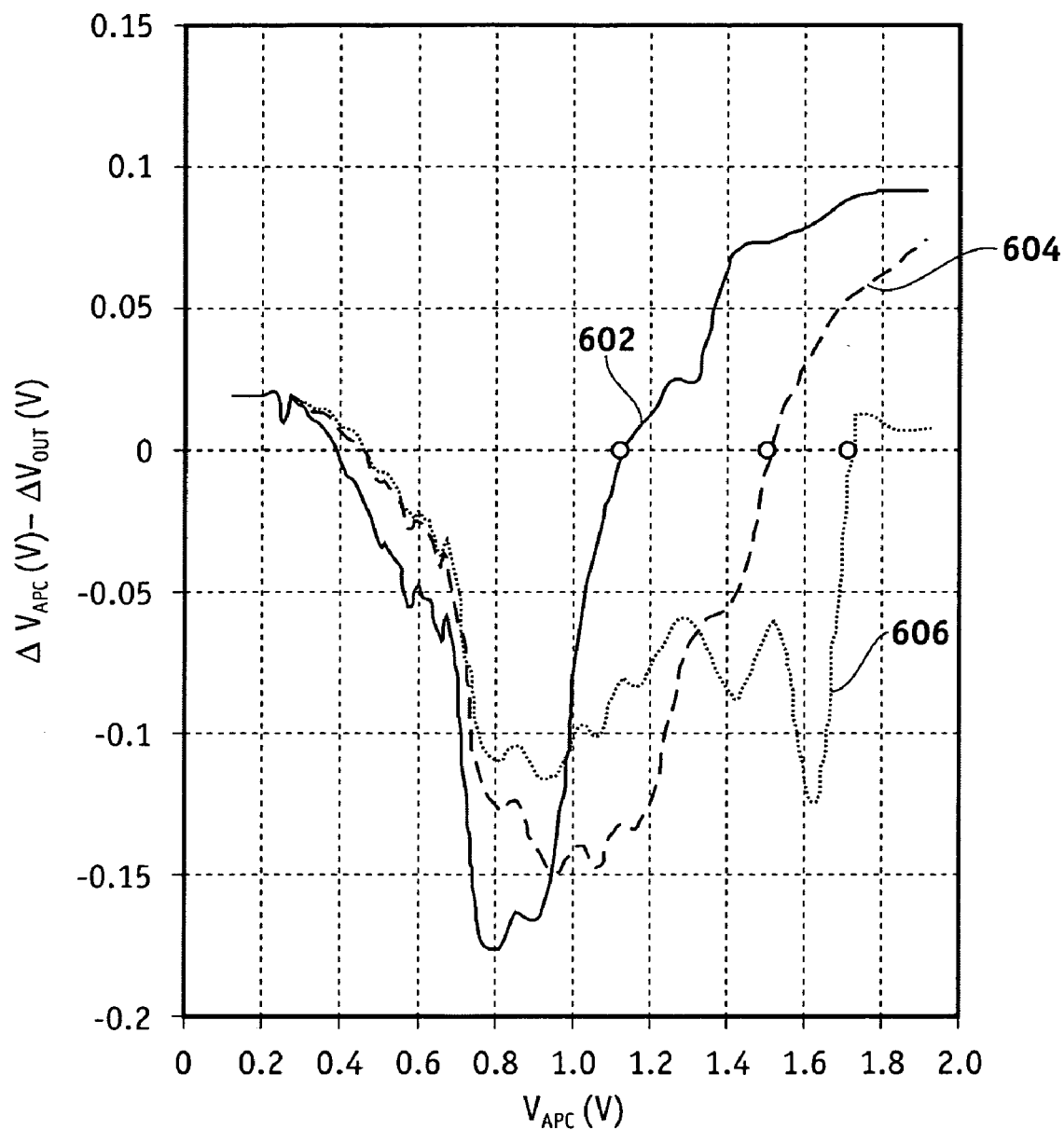
FIG. 6 is a graph depicting soft saturation detection characteristics for different output loading conditions.

Operation of a soft saturation detection circuit as described herein is depicted in FIG. 6, which is a graph depicting the difference of the inputs to derivative comparator 310 for different output loading conditions. Plot 602 corresponds to the worst case VSWR condition, plot 604 corresponds to the nominal 50 ohm load condition, and plot 606 corresponds to the best case VSWR condition. The zero point on the vertical scale represents the onset of power limiting caused by soft saturation detection. Values less than zero correspond to no power limiting, and values greater than zero correspond to power limiting.

Figure 7:
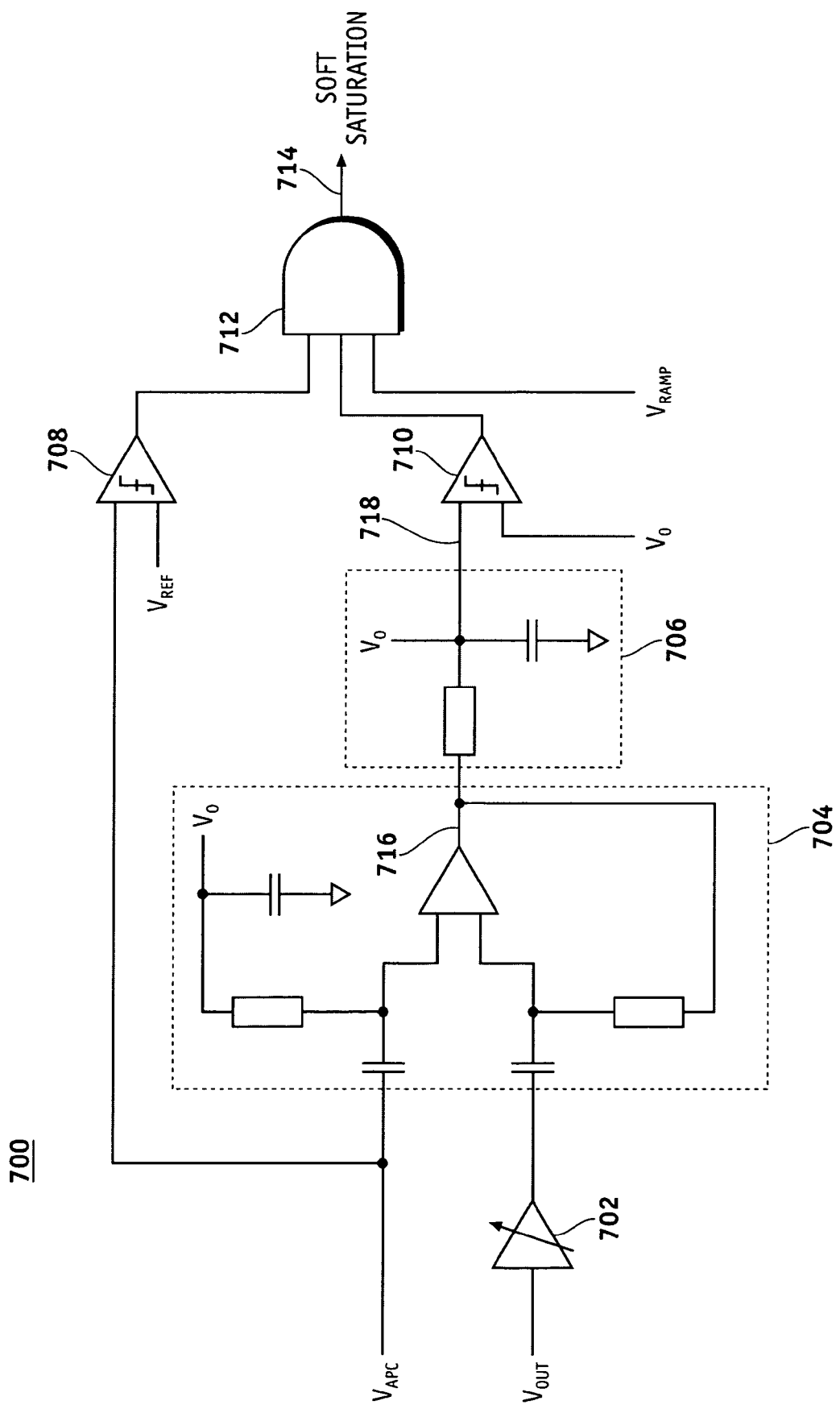
FIG. 7 is a schematic diagram of a soft saturation detection circuit configured in accordance with one practical implementation of the invention.

A soft saturation detection circuit as conceptually described above can be implemented in a number of different practical ways. For example, FIG. 7 is a schematic diagram of a soft saturation detection circuit 700 configured in accordance with one practical implementation of the invention. Circuit 700 is suitable for use in GSM applications where the amplitude of the RF output signal is not modulated beyond transmission burst ramp-up and ramp-down. Some of the elements, features, and functions of circuit 700 have been described above in connection with FIG. 2 and FIG. 3; such common elements, features, and functions will not be redundantly described in the context of circuit 700.

Circuit 700 generally includes analog circuit components that form a gain element 702, analog circuit components that form a differentiator 704, analog circuit components that form a low pass filter 706, a reference voltage comparator 708, a time derivative voltage comparator 710, and an AND gate 712. Circuit 700 obtains $V_{APC}$ and $V_{OUT}$ signals as inputs, and generates a soft saturation indication signal 714 as an output. The output of circuit 700 (which may be routed to the transmitter baseband logic) is a logic high value when soft saturation is detected, and is otherwise a logic low value.

Gain element 702 may be realized with at least one variable resistance that enables the selection of the constant, A. In practice, gain element 702 considers the maximum power detector loss and A is selected in an appropriate manner. The values of the resistances and capacitances in differentiator 704 are selected such that the RC time constant matches the transmit ramp time constant, which is desirable to best utilize dynamic range. Differentiator 704 is configured such that its output (labeled 716 in FIG. 7) represents the quantity $$A\frac{dV_{OUT}}{dt}$$

subtracted from the quantity $$\frac{dV_{APC}}{dt}.$$

The voltage ($V_O$) represents a slight constant voltage offset, which may be necessary to ensure proper operation of differentiator 704 in practical embodiments. In practice, differentiator 704 may be realized with any combination of components, circuits, and elements, and differentiator 704 need not be conveniently "packaged" in an easily discernable topology as depicted in FIG. 7.

Low pass filter 706 is utilized in practical embodiments because differentiator 704 effectively functions as a high pass filter, which can generate unwanted noise (low pass filter 706 attenuates the noise components). In this example, low pass filter 706 is configured such that its RC time constant is well above that of the applicable modulation. The voltage ($V_O$) represents a slight constant voltage offset, which may be necessary to ensure proper operation of comparator 710 in practical embodiments. The output of low pass filter 706 (labeled 718 in FIG. 7) is therefore proportional to $$\left(\frac{dV_{APC}}{dt} - A\frac{dV_{OUT}}{dt}\right) + V_O.$$

Time derivative comparator 710 compares the voltage represented by the expression $$\left(\frac{dV_{APC}}{dt} - A\frac{dV_{OUT}}{dt}\right) + V_O$$

to the $V_O$ voltage. In this example, comparator 710 generates a logic high value if the quantity $$\left(\frac{dV_{APC}}{dt} - A\frac{dV_{OUT}}{dt}\right) + V_O$$

is greater than the $V_O$ voltage, and a logic low value otherwise. In other words, comparator 710 effectively generates a logic high value if $$A\frac{dV_{OUT}}{dt} < \frac{dV_{APC}}{dt}.$$

Reference voltage comparator 708 compares $V_{APC}$ to $V_{REF}$ (this reference voltage is described in more detail above), generates a logic high value if $V_{APC}$ is greater than $V_{REF}$, and otherwise generates a logic low value. The $V_{RAMP}$ signal is a logic high value when a transmission burst is starting and the output is known to be increasing, and is otherwise a logic low value. As mentioned above, the $V_{RAMP}$ signal can be an external input or it can be created by ramp detector 312 (see FIG. 3).

AND gate 712 receives the output of reference voltage comparator 708, the output of time derivative comparator 710, and the $V_{RAMP}$ signal as inputs. If all three of these inputs are logic high values, then AND gate 712 generates a logic high value as an output for soft saturation indication signal 714. Otherwise, AND gate 712 will generate a logic low value as an output for soft saturation indication signal 714.

In a practical embodiment, the resistances and capacitances in differentiator 704 can be selected in a manner that obviates the need for gain element 702. In other words, the constant A set forth in the above expressions can be realized by tuning the RC time constants in differentiator 704. In such an embodiment, gain element 702 need not be utilized.

Figure 8:
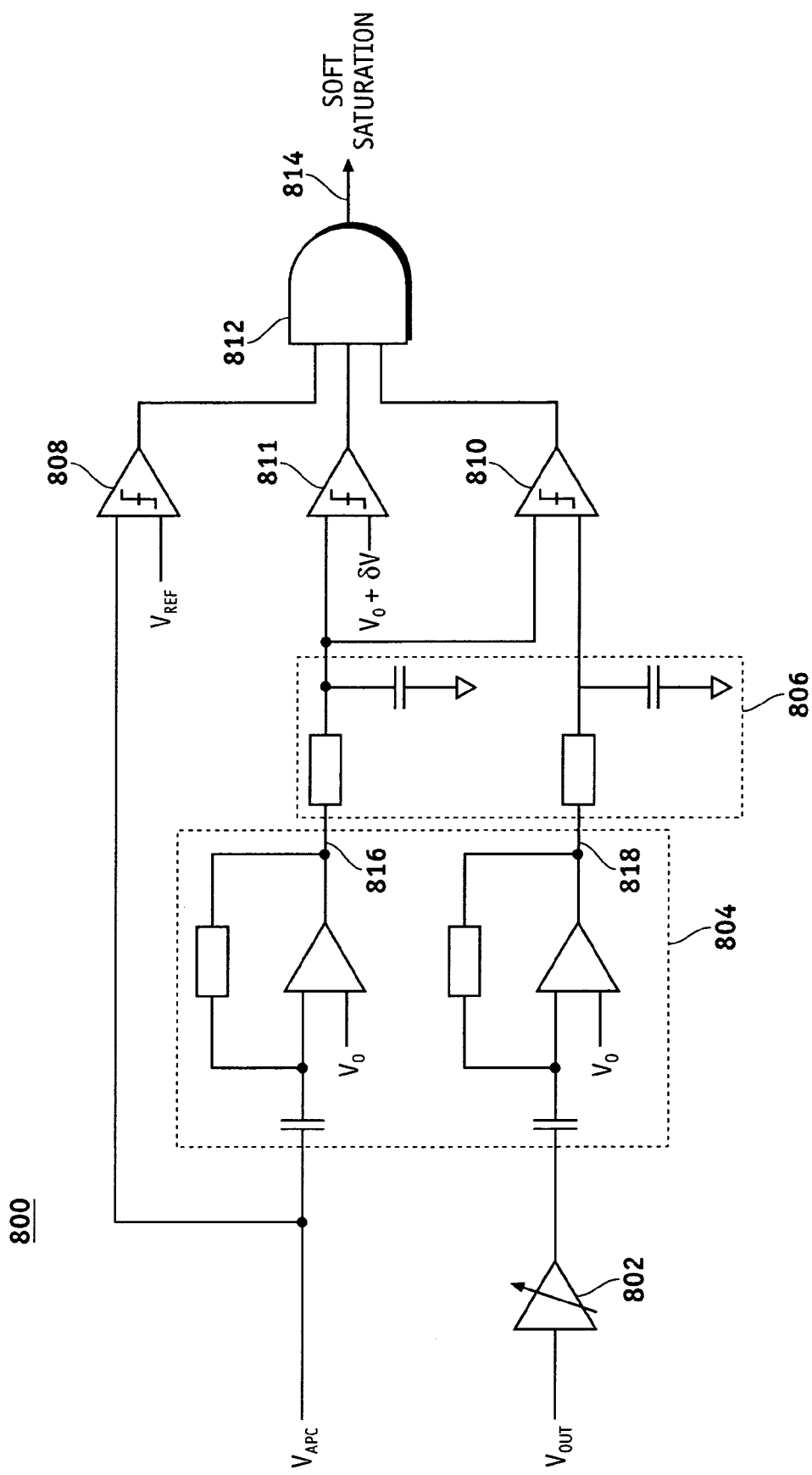
FIG. 8 is a schematic diagram of a soft saturation detection circuit configured in accordance with another practical implementation of the invention.

FIG. 8 is a schematic diagram of a soft saturation detection circuit 800 configured in accordance with another practical implementation of the invention. Circuit 800 is suitable for use in EDGE applications where the amplitude of the RF output signal is modulated. Thus, circuit 800 provides soft saturation detection for the rising edge of the transmit burst, along with early warning of distortion for amplitude modulated signals, which allows the transmitter to avoid generating spurious out-of-band signals due to modulation as well as burst transients. In this regard, circuit 800 is suitably configured to detect the onset of soft saturation that might be caused by modulation peaks of the RF output signal. Some of the elements, features, and functions of circuit 800 have been described above in connection with FIG. 2, FIG. 3, and FIG. 7; such common elements, features, and functions will not be redundantly described in the context of circuit 800.

Circuit 800 generally includes analog circuit components that form a gain element 802, analog circuit components that form a differentiator 804, analog circuit components that form a low pass filter 806, a reference voltage comparator 808, a time derivative voltage comparator 810, a voltage comparator 811, and an AND gate 812. Circuit 800 obtains $V_{APC}$ and $V_{OUT}$ signals as inputs, and generates a soft saturation indication signal 814 as an output. The output of circuit 800 (which may be routed to the transmitter baseband logic) is a logic high value when soft saturation is detected, and is otherwise a logic low value.

Gain element 802 may be realized with at least one variable resistance that enables the selection of the constant, A. In this example, differentiator 804 is realized with two separate time derivative circuits: one for the $V_{APC}$ signal and one for the $V_{OUT}$ signal. The values of the resistances and capacitances in differentiator 804 are selected such that the RC time constant matches the transmit ramp time constant. A first output 816 of differentiator 804 represents the quantity $$\frac{dV_{APC}}{dt} + V_O,$$

and a second output 818 of differentiator 804 represents the quantity $$A\frac{dV_{OUT}}{dt} + V_O.$$

The voltage ($V_O$) represents a slight constant voltage offset, which may be necessary to ensure proper operation of differentiator 804 in practical embodiments. In practice, differentiator 804 may be realized with any combination of components, circuits, and elements, and differentiator 804 need not be conveniently "packaged" in an easily discernable topology as depicted in FIG. 8.

In this example, low pass filter 806 is realized with two separate filter circuits (one for each "branch" of circuit 800). As mentioned above in connection with circuit 700, low pass filter 806 is configured such that the RC time constants of the filter circuits are each well above that of the applicable modulation.

Time derivative comparator 810 compares the voltage represented by the expression $$\frac{dV_{APC}}{dt} + V_O$$

to the voltage represented by the expression $$A\frac{dV_{OUT}}{dt} + V_O.$$

In this example, comparator 810 generates a logic high value if the quantity $$\frac{dV_{APC}}{dt} + V_O$$

is greater than the quantity $$A\frac{dV_{OUT}}{dt} + V_O,$$

and a logic low value otherwise. In other words, comparator 810 effectively generates a logic high value if $$A\frac{dV_{OUT}}{dt} < \frac{dV_{APC}}{dt}.$$

Reference voltage comparator 808 compares $V_{APC}$ to $V_{REF}$, generates a logic high value if $V_{APC}$ is greater than $V_{REF}$, and otherwise generates a logic low value. Voltage comparator 811 compares the quantity $$\frac{dV_{APC}}{dt} + V_O$$

to the voltage represented by the expression $V_O+\delta V$, where $\delta V$ is a constant and arbitrary voltage offset that is utilized to ensure that circuit 800 triggers at a slope that is slightly greater than zero, which avoids false triggering. In this example, voltage comparator 811 generates a logic high value if the quantity $$\frac{dV_{APC}}{dt} + V_O$$

is greater than the quantity $V_O+\delta V$, and otherwise generates a logic low value. In other words, voltage comparator 811 effectively generates a logic high value if $$\frac{dV_{APC}}{dt}$$

is greater than $\delta V$, which ensures that $V_{APC}$ is actually increasing. Thus, circuit 800 can utilize increasing levels of the modulated RF output power signal as a gating mechanism for the soft saturation indication signal 814 (in contrast to the ramp signal indicator signal utilized by circuit 700).

AND gate 812 receives the output of reference voltage comparator 808, the output of time derivative comparator 810, and the output of voltage comparator 811 as inputs. If all three of these inputs are logic high values, then AND gate 812 generates a logic high value as an output for soft saturation indication signal 814. Otherwise, AND gate 812 will generate a logic low value as an output for soft saturation indication signal 814.

In a practical embodiment, the resistances and capacitances in differentiator 804 and/or the resistances and capacitances in low pass filter 806 can be selected in a manner that obviates the need for gain element 802. In other words, the constant A set forth in the above expressions can be realized by tuning RC time constants. In such an embodiment, gain element 802 need not be utilized.

In summary, systems, devices, and methods configured in accordance with example embodiments of the invention relate to:

A method for detecting soft saturation of an RF power amplifier, said method comprising: obtaining an output voltage signal, $V_O$, indicative of output power of the RF power amplifier; obtaining an output power control voltage signal, $V_C$, for the RF power amplifier; calculating a time derivative of said output voltage signal, $$\frac{dV_O}{dt};$$

calculating a time derivative of said output power control voltage signal, $$\frac{dV_C}{dt};$$

and determining onset of soft saturation based upon $$\frac{dV_O}{dt} \text{ and } \frac{dV_C}{dt}.$$

The output power control voltage signal may comprise an error control signal for the RF power amplifier. The output power control voltage signal may be generated in response to said output voltage signal. The method may further comprise indicating soft saturation if $$\frac{dV_O}{dt} \bigg/ \frac{dV_C}{dt} < \frac{1}{A},$$

where A is constant over time. In one embodiment, A is less than one. The method may further comprise indicating soft saturation if $$A\frac{dV_O}{dt} < \frac{dV_C}{dt}, \text{ and if } \frac{dV_C}{dt} < 0,$$

where A is constant over time. The method may further comprise generating a soft saturation indication signal upon onset of soft saturation. The method may further comprise disabling generation of said soft saturation indication signal if said output power control voltage signal is less than a threshold voltage. The method may further comprise disabling generation of said soft saturation indication signal if said output voltage signal is not increasing with time.

A soft saturation detection circuit for an RF power amplifier, said circuit comprising: a gain element configured to multiply an output voltage signal, $V_O$, by a constant, A, to obtain a scaled output voltage signal, $AV_O$, said output voltage signal being indicative of output power of the RF power amplifier; a differentiator having a first differentiator input for an output power control voltage signal, $V_C$, for the RF power amplifier, and a second differentiator input for said scaled output voltage signal, said differentiator being configured to generate a time derivative of said scaled output voltage signal, $$A\frac{dV_O}{dt},$$

and a time derivative of said output power control voltage signal, $$\frac{dV_C}{dt};$$

and a soft saturation signal generator configured to determine onset of soft saturation based upon $$A\frac{dV_O}{dt} \text{ and } \frac{dV_C}{dt}.$$

In one embodiment, A is less than one. The output power control voltage signal may comprise an error control signal for the RF power amplifier. The output power control voltage signal may be generated in response to said output voltage signal. The soft saturation signal generator may be configured to indicate soft saturation if $$\frac{dV_O}{dt} / \frac{dV_C}{dt} < \frac{1}{A}.$$

The soft saturation signal generator may be configured to indicate soft saturation if $$A\frac{dV_O}{dt} < \frac{dV_C}{dt}, \text{ and if } \frac{dV_C}{dt} > 0.$$

The soft saturation signal generator may comprise a gating mechanism configured to enable generation of a soft saturation indication signal if:

$$A\frac{dV_O}{dt} < \frac{dV_C}{dt}; \text{ and if } V_C > V_{REF},$$

where $V_{REF}$ is a fixed threshold voltage; and if $$\frac{dV_C}{dt} > 0.$$

An electronic circuit comprising: a radio frequency ("RF") power amplifier configured to generate an RF output power signal in response to an output power control voltage signal, $V_C$; an output power control architecture coupled to said RF power amplifier, said output power control architecture being configured to obtain an output voltage signal, $V_O$, indicative of said RF output power signal; and a soft saturation detection circuit coupled to said output power control architecture, said soft saturation detection circuit being configured to process $V_O$ and $V_C$ to determine onset of soft saturation of said RF power amplifier. The soft saturation detection circuit may be configured to determine onset of soft saturation of said RF power amplifier in response to a time derivative of said output voltage signal, $$\frac{dV_O}{dt},$$

and a time derivative of said output power control voltage signal, $$\frac{dV_C}{dt}.$$

The soft saturation detection circuit may be configured to indicate soft saturation of said RF power amplifier if $$A\frac{dV_O}{dt} < \frac{dV_C}{dt}, \text{ and if } \frac{dV_C}{dt} < 0,$$

where A is constant over time.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A method for detecting soft saturation of a radio frequency ("RF") power amplifier, said method comprising:
    obtaining an output voltage signal, $V_O$, indicative of output power of the RF power amplifier;
    obtaining an output power control voltage signal, $V_C$, for the RF power amplifier;
    calculating a time derivative of said output voltage signal, $$\frac{dV_O}{dt};$$

calculating a time derivative of said output power control voltage signal, $$\frac{dV_C}{dt};$$

and
    determining onset of soft saturation based upon $$\frac{dV_O}{dt} \text{ and } \frac{dV_C}{dt}.$$

2. A method according to claim 1, said output power control voltage signal comprising an error control signal for the RF power amplifier.

3. A method according to claim 1, said output power control voltage signal being generated in response to said output voltage signal.

4. A method according to claim 1, further comprising indicating soft saturation if $$\frac{dV_O}{dt} \bigg/ \frac{dV_C}{dt} < \frac{1}{A},$$

where A is constant over time.

5. A method according to claim 4, wherein A is less than one.

6. A method according to claim 1, further comprising indicating soft saturation if $$A\frac{dV_O}{dt} < \frac{dV_C}{dt}, \text{ and if } \frac{dV_C}{dt} > 0,$$

where A is constant over time.

7. A method according to claim 6, wherein A is less than one.

8. A method according to claim 1, further comprising generating a soft saturation indication signal upon onset of soft saturation.

9. A method according to claim 8, further comprising disabling generation of said soft saturation indication signal if said output power control voltage signal is less than a threshold voltage.

10. A method according to claim 8, further comprising disabling generation of said soft saturation indication signal if said output voltage signal is not increasing with time.

11. A method according to claim 1, wherein calculating said time derivative of said output voltage signal comprises calculating a scaled time derivative of said output voltage signal.

12. A soft saturation detection circuit for a radio frequency ("RF") power amplifier, said circuit comprising:
    a gain element configured to multiply an output voltage signal, $V_O$, by a constant, A, to obtain a scaled output voltage signal, $AV_O$, said output voltage signal being indicative of output power of the RF power amplifier;
    a differentiator having a first differentiator input for an output power control voltage signal, $V_C$, for the RF power amplifier, and a second differentiator input for said scaled output voltage signal, said differentiator being configured to generate a time derivative of said scaled output voltage signal, $$A\frac{dV_O}{dt},$$

and a time derivative of said output power control voltage signal, $$\frac{dV_C}{dt};$$

and
    a soft saturation signal generator configured to determine onset of soft saturation based upon $$A\frac{dV_O}{dt} \text{ and } \frac{dV_C}{dt}.$$

13. A soft saturation detection circuit according to claim 12, wherein A is less than one.

14. A soft saturation detection circuit according to claim 12, said output power control voltage signal comprising an error control signal for the RF power amplifier.

15. A soft saturation detection circuit according to claim 12, said output power control voltage signal being generated in response to said output voltage signal.

16. A soft saturation detection circuit according to claim 12, said soft saturation signal generator being configured to indicate soft saturation if $$\frac{dV_O}{dt} \bigg/ \frac{dV_C}{dt} < \frac{1}{A}.$$

17. A soft saturation detection circuit according to claim 12, said soft saturation signal generator being configured to indicate soft saturation if $$A\frac{dV_O}{dt} < \frac{dV_C}{dt}, \text{ and if } \frac{dV_C}{dt} > 0.$$

18. A soft saturation detection circuit according to claim 17, said soft saturation signal generator comprising a gating mechanism configured to enable generation of a soft saturation indication signal if:

$$A\frac{dV_O}{dt} < \frac{dV_C}{dt};$$

and if $V_C > V_{REF}$, where $V_{REF}$ is a fixed threshold voltage; and if $$\frac{dV_C}{dt} > 0.$$

19. An electronic circuit comprising:
a radio frequency ("RF") power amplifier configured to generate an RF output power signal in response to an output power control voltage signal, $V_C$;
an output power control architecture coupled to said RF power amplifier, said output power control architecture being configured to obtain an output voltage signal, $V_O$, indicative of said RF output power signal; and
a soft saturation detection circuit coupled to said output power control architecture, said soft saturation detection circuit being configured to process $V_O$ and $V_C$ to determine onset of soft saturation of said RF power amplifier, said soft saturation detection circuit being configured to determine onset of soft saturation of said RF power amplifier in response to a time derivative of said output voltage signal, $$\frac{dV_O}{dt},$$

and a time derivative of said output power control voltage signal, $$\frac{dV_C}{dt}.$$

20. An electronic circuit according to claim 19, said soft saturation detection circuit being configured to indicate soft saturation of said RF power amplifier if $$A\frac{dV_O}{dt} < \frac{dV_C}{dt},$$

and if $$\frac{dV_C}{dt} > 0,$$

where A is constant over time.

* * * * *